(12) United States Patent
Kawahara et al.

(10) Patent No.: US 11,492,528 B2
(45) Date of Patent: Nov. 8, 2022

(54) HEAT DISSIPATION SHEET, METHOD FOR PRODUCING HEAT DISSIPATION SHEET, AND LAMINATE

(71) Applicant: SEKISUI CHEMICAL CO., LTD., Osaka (JP)

(72) Inventors: Yuko Kawahara, Tsukuba (JP); Keigo Oowashi, Osaka (JP); Kouji Ashiba, Osaka (JP); Rui Zhang, Osaka (JP); Osamu Inui, Osaka (JP); Hiroshi Maenaka, Tsukuba (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 263 days.

(21) Appl. No.: 16/623,172

(22) PCT Filed: Jun. 21, 2018

(86) PCT No.: PCT/JP2018/023690
§ 371 (c)(1),
(2) Date: Dec. 16, 2019

(87) PCT Pub. No.: WO2018/235919
PCT Pub. Date: Dec. 27, 2018

(65) Prior Publication Data
US 2021/0139761 A1 May 13, 2021

(30) Foreign Application Priority Data
Jun. 23, 2017 (JP) .............................. JP2017-123510

(51) Int. Cl.
| | | |
|---|---|---|
| *B32B 7/06* | (2019.01) | |
| *B32B 15/09* | (2006.01) | |
| *B32B 15/20* | (2006.01) | |
| *B32B 27/08* | (2006.01) | |
| *B32B 27/20* | (2006.01) | |
| *B32B 27/34* | (2006.01) | |
| *B32B 27/36* | (2006.01) | |
| *B32B 27/06* | (2006.01) | |
| *B32B 27/18* | (2006.01) | |
| *C09K 5/14* | (2006.01) | |
| *C08K 7/00* | (2006.01) | |
| *C08K 3/08* | (2006.01) | |
| *C08K 3/38* | (2006.01) | |
| *H05K 3/38* | (2006.01) | |
| *H05K 7/20* | (2006.01) | |
| *B32B 37/10* | (2006.01) | |
| *H01L 23/373* | (2006.01) | |
| *H05K 1/03* | (2006.01) | |

(52) U.S. Cl.
CPC .............. *C09K 5/14* (2013.01); *B32B 7/06* (2013.01); *B32B 15/09* (2013.01); *B32B 15/20* (2013.01); *B32B 27/08* (2013.01); *B32B 27/20* (2013.01); *B32B 27/34* (2013.01); *B32B 27/36* (2013.01); *C08K 3/08* (2013.01); *C08K 3/38* (2013.01); *B32B 37/1018* (2013.01); *B32B 2264/107* (2013.01); *B32B 2264/1023* (2020.08); *B32B 2307/304* (2013.01); *B32B 2307/732* (2013.01); *C08K 2003/0812* (2013.01); *C08K 2003/385* (2013.01); *C08K 2201/001* (2013.01); *C08K 2201/005* (2013.01); *C08K 2201/014* (2013.01); *C08K 2201/016* (2013.01); *H01L 23/3733* (2013.01); *H01L 23/3735* (2013.01); *H05K 1/0373* (2013.01); *H05K 2201/0209* (2013.01)

(58) Field of Classification Search
None
See application file for complete search history.

(56) References Cited

U.S. PATENT DOCUMENTS

| | | | |
|---|---|---|---|
| 2016/0340191 A1* | 11/2016 | Ikemiya | ................. C09K 5/14 |
| 2018/0354793 A1 | 12/2018 | Ikemiya et al. | |
| 2019/0077133 A1 | 3/2019 | Sawaguchi et al. | |

FOREIGN PATENT DOCUMENTS

| | | |
|---|---|---|
| JP | 2012-219251 A | 11/2012 |
| JP | 2013-32496 A | 2/2013 |
| JP | 6135817 B1 | 5/2017 |
| JP | 2017-94541 A | 6/2017 |
| TW | 201536715 A | 10/2015 |

OTHER PUBLICATIONS

Written Opinion of the International Searching Authority (PCT/ISA/237) for Application No. PCT/JP2018/023690 dated Aug. 21, 2018 (English Translation mailed Jan. 2, 2020).

(Continued)

*Primary Examiner* — Sheeba Ahmed
(74) *Attorney, Agent, or Firm* — Cheng Law Group, PLLC

(57) ABSTRACT

Provided is a heat dissipation sheet capable of effectively enhancing adhesiveness and long-term insulation reliability. The heat dissipation sheet according to the present invention contains first inorganic particles having an aspect ratio of 2 or less, second inorganic particles having an aspect ratio of more than 2, and a binder resin. In this heat dissipation sheet, a content of the second inorganic particles is larger than a content of the first inorganic particles in 100% by volume of a region having a thickness of 15% on a first surface side in a thickness direction, and the content of the first inorganic particles in 100% by volume of the region having a thickness of 15% is larger than the content of the first inorganic particles in 100% by volume of a central region having a thickness of 70%.

14 Claims, 2 Drawing Sheets

(56) References Cited

OTHER PUBLICATIONS

Taiwanese Office Action for the Application No. 107121463 dated Oct. 22, 2021.
International Search Report for the Application No. PCT/JP2018/023690 dated Aug. 21, 2018.
Written Opinion of the International Searching Authority (PCT/ISA/237) for Application No. PCT/JP2018/023690 dated Aug. 21, 2018.
Supplementary European Search Report for the Application No. EP 18 820 102.4 dated Mar. 10, 2021.

* cited by examiner

[FIG. 1]
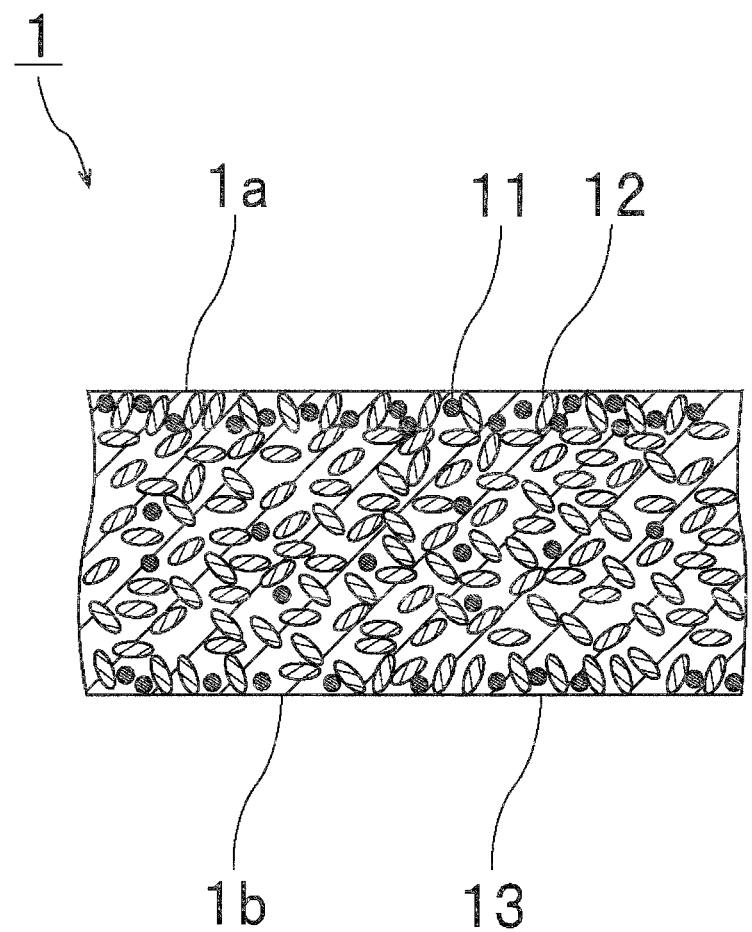

[FIG. 2]
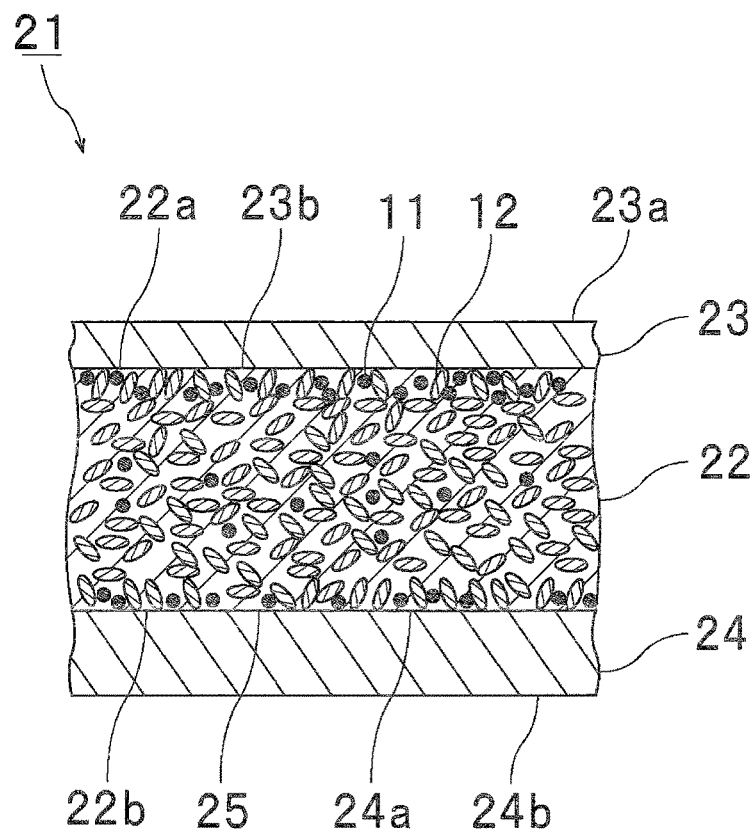
[FIG. 3]
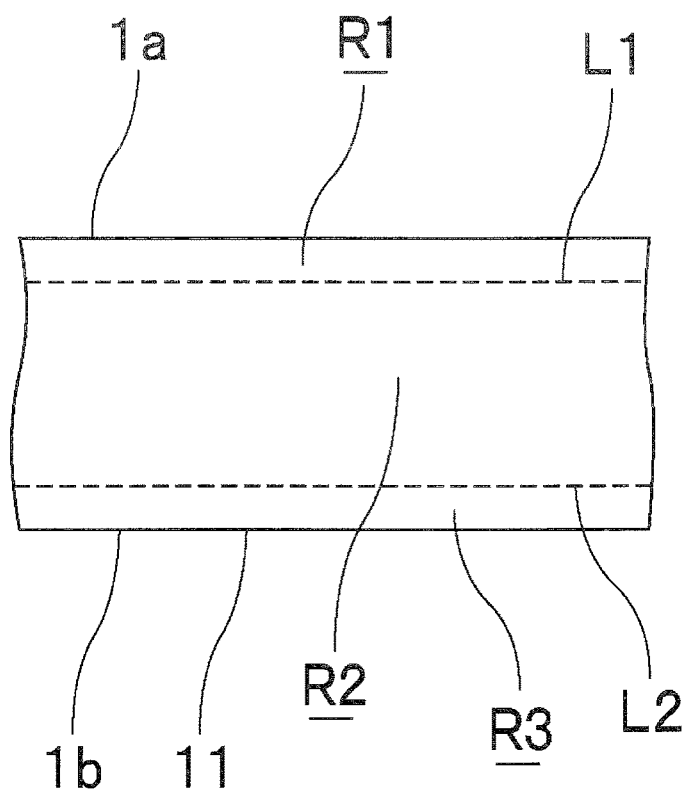

HEAT DISSIPATION SHEET, METHOD FOR PRODUCING HEAT DISSIPATION SHEET, AND LAMINATE

TECHNICAL FIELD

The present invention relates to a heat dissipation sheet containing inorganic particles and a binder resin, and a method for producing a heat dissipation sheet. The present invention also relates to a laminate including an insulating layer containing inorganic particles and a binder resin.

BACKGROUND

Electronic and electrical apparatuses have recently been downsized and allowed to have higher performance, and thus electronic components have been mounted with a higher package density. Thus, how to dissipate heat generated from the electronic component in a narrow space is a problem. Since the heat generated from the electronic component is directly linked to reliability of electronic and electrical apparatuses, efficient dissipation of the generated heat is an urgent issue.

As one means for solving the above problems, there is a means using a ceramic substrate having high thermal conduction as a heat dissipation substrate on which a power semiconductor device or the like is mounted. Examples of such a ceramic substrate include an alumina substrate and an aluminum nitride substrate.

However, the means using a ceramic substrate has problems that it is difficult to form a multilayer, processability is poor, and the cost s very high. In addition, since a difference in linear expansion coefficient between the ceramic substrate and a copper circuit is large, there is also a problem that the copper circuit tends to peel off during a cooling and heating cycle.

Thus, a resin composition using boron nitride having a low linear expansion coefficient, in particular, hexagonal boron nitride has attracted attention as a heat dissipation material. A crystal structure of hexagonal boron nitride is a layered structure of a hexagonal network similar to graphite, and a particle shape of hexagonal boron nitride is scaly. Thus, it is known that hexagonal boron nitride has a property that the thermal conductivity in the plane direction is higher than the thermal conductivity in the thickness direction, and the thermal conductivity is anisotropic. The resin composition described above may be used as a thermally conductive sheet or a prepreg.

An example of a thermally conductive sheet containing boron nitride is disclosed in Patent Document 1 below. Patent Document 1 discloses a thermally conductive sheet in which some or all of boron nitride particles are dispersed in a thermosetting resin in the form of agglomerated particles. The thermally conductive sheet further contains metal oxide particles. In the thermally conductive sheet, the total content of the metal oxide particles and the boron nitride particles is 40% by volume to 70% by volume. In the thermally conductive sheet, a volume ratio of the metal oxide particles and the boron nitride particles is 10:90 to 50:50. In the thermally conductive sheet, a median diameter of the metal oxide particles is 0.5 μm to 30 μm.

Patent Document 2 below discloses a thermal conductive insulating sheet containing a thermal conductive spherical filler (excluding boron nitride), boron nitride, and a binder resin. The thermal conductive insulating sheet satisfies the following conditions (1) to (7). Condition (1): The thermal conductive insulating sheet has a porosity of 0.2 or less. Condition (2): The thermal conductive insulating sheet includes a layer (A) that contains a thermal conductive spherical filler (excluding boron nitride) and optionally contains boron nitride and a layer (B) that contains boron nitride and optionally contains a thermal conductive spherical filler (excluding boron nitride). Condition (3): The layer (A) and the layer (B) are alternately laminated such that the layer (B) is not positioned on an outermost layer, Condition (4): A mass of the thermal conductive spherical filler (excluding boron nitride) that is optionally contained in the outermost layer ($A_{out}$) is relatively larger than a mass of the thermal conductive spherical filler (excluding boron nitride) that is optionally contained in the layer (B). Condition (5): The total content of the thermal conductive spherical filler (excluding boron nitride) and the boron nitride in the layer ($A_{out}$) is more than 50% by volume relative to 100% by volume of sum of the thermal conductive spherical filler (excluding boron nitride), the boron nitride, and a binder resin in the layer ($A_{out}$). Condition (6): The boron nitride is scaly primary particles or granules obtained by granulating scaly primary particles. Condition (7): The layer (B) includes 30% by mass to 90% by mass of boron nitride with respect to a total of 100% by mass of the thermal conductive spherical filler (excluding boron nitride), boron nitride, and the binder resin.

An example of a prepreg containing boron nitride is disclosed in Patent Document 3 below. Patent Document 3 discloses a prepreg for heat and pressure molding, in which a thermosetting resin composition containing an inorganic filler containing two or more components is in a sheet-like and semi-cured state. The inorganic filler includes a filler (1) which is an aggregate of primary particles having an average particle diameter d1 of 10 μm or more and 70 μm or less. The inorganic filler is in the form of particles and includes a filler (2) in which an average particle diameter d2 of the particles is 0.1 μm or more and 30 μm or less. In the thermosetting resin composition, the content of the filler (1) is 5% by volume to 40% by volume relative to 100% by volume of sum of thermosetting resin solids and the inorganic filler. In the thermosetting resin composition, the content of the filler (2) is 10% by volume to 50% by volume relative to 100% by volume of sum of thermosetting resin solids and the inorganic filler. The total content of the inorganic filler is 20% by volume to 80% by volume in 100% by volume of the thermosetting resin composition.

RELATED ART DOCUMENTS

Patent Documents

Patent Document 1: JP 2013-32496 A
Patent Document 2: JP 6135817 B1
Patent Document 3: JP 2012-219251 A

SUMMARY OF THE INVENTION

Problems to be Solved by the Invention

The conventional thermally conductive sheet containing boron nitride as described in Patent Documents 1 to 3 may be laminated on copper foil, a metal plate, or the like to be used as a laminate. In the laminate, a circuit pattern may be formed by treating the copper foil by etching or the like.

In the conventional thermally conductive sheet or the like containing boron nitride as described in Patent Documents 1 to 3, although the thermal conduction can be enhanced because boron nitride is used, it is difficult to enhance adhesiveness between the thermally conductive sheet or the like and the copper foil. In the conventional thermal conductive insulating sheet as described in Patent Document 2, the thermal conductivity of the outermost layer is low due to the configuration of the thermal conductive insulating sheet, and thermal resistance of the outermost layer is increased. Therefore, it is difficult to enhance the thermal conduction of the entire thermal conductive insulating sheet. In the conventional thermally conductive sheet or the like containing boron nitride, it is difficult to achieve both the thermal conduction and the adhesiveness.

Furthermore, in the conventional thermally conductive sheet or the like containing boron nitride, voids may be generated to reduce insulation properties. In addition, when the conventional thermally conductive sheet or the like containing boron nitride is used for the laminate, it is difficult to enhance the adhesiveness between the thermally conductive sheet or the like and the copper foil as described above, so that the formed circuit pattern may peel off from the laminate. When the circuit pattern peels off, partial discharge may occur between the peeled circuit pattern and an outer surface of the laminate to deteriorate the laminate. As a result, long-term insulation reliability may be reduced.

An object of the present invention is to provide a heat dissipation sheet capable of effectively enhancing the adhesiveness and the long-term insulation reliability and a method for producing a heat dissipation sheet. Another object of the present invention is to provide a laminate capable of effectively enhancing the adhesiveness and the long-term insulation reliability.

MEANS FOR SOLVING THE PROBLEMS

According to a broad aspect of the present invention, there is provided a heat dissipation sheet containing first inorganic particles having an average aspect ratio of 2 or less, second inorganic particles having an average aspect ratio of more than 2, and a binder resin. The heat dissipation sheet has a first surface on one side in a thickness direction and a second surface on the other side in the thickness direction, a content of the second inorganic particles is larger than a content of the first inorganic particles in 100% by volume of a region having a thickness of 15% from the first surface to the second surface, and the content of the first inorganic particles in 100% by volume of the region having a thickness of 15% from the first surface to the second surface is larger than the content of the first inorganic particles in 100% by volume of a region having a thickness of 70% from a position 15/100 of the thickness to a position 85/100 of the thickness from the first surface to the second surface.

In a specific aspect of the heat dissipation sheet according to the present invention, the heat dissipation sheet contains 30% by volume or less of the first inorganic particles relative to 100% by volume of sum of the first inorganic particles and the second inorganic particles.

In a specific aspect of the heat dissipation sheet according to the present invention, an average particle diameter of the first inorganic particles is less than 20 μm.

In a specific aspect of the heat dissipation sheet according to the present invention, a material of the first inorganic particles includes an aluminum element or a carbon element.

In a specific aspect of the heat dissipation sheet according to the present invention, an average circularity of the first inorganic particles is 0.9 or more.

In a specific aspect of the heat dissipation sheet according to the present invention, the average aspect ratio of the second inorganic particles is 15 or less.

In a specific aspect of the heat dissipation sheet according to the present invention, a material of the second inorganic particles is boron nitride.

In a specific aspect of the heat dissipation sheet according to the present invention, the boron nitride is agglomerated particles.

In a specific aspect of the heat dissipation sheet according to the present invention, thermal conductivity of the first inorganic particles and thermal conductivity of the second inorganic particles are each 10 W/m·K or more.

In a specific aspect of the heat dissipation sheet according to the present invention, the binder resin contains a thermosetting compound and a thermosetting agent.

According to a broad aspect of the present invention, a method for producing the heat dissipation sheet described above is provided. The method includes a step of blending the first inorganic particles having an average aspect ratio of 2 or less, the second inorganic particles having an average aspect ratio of more than 2, and the binder resin.

According to a broad aspect of the present invention, there is provided a laminate including a thermal conductor, an insulating layer laminated on one surface of the thermal conductor, and a conductive layer laminated on a surface of the insulating layer opposite to the thermal conductor. In this laminate, the insulating layer contains first inorganic particles having an average aspect ratio of 2 or less, second inorganic particles having an average aspect ratio of more than 2, and a binder resin, the insulating layer has a first surface on one side in a thickness direction and a second surface on the other side in the thickness direction, a content of the second inorganic particles is larger than a content of the first inorganic particles in 100% by volume of a region having a thickness of 15% from the first surface to the second surface of the insulating layer, and the content of the first inorganic particles in 100% by volume of the region having a thickness of 15% from the first surface to the second surface of the insulating layer is larger than the content of the first inorganic particles in 100% by volume of a region having a thickness of 70% from a position 15/100 of the thickness to a position 85/100 of the thickness from the first surface to the second surface of the insulating layer.

Effect of the Invention

The heat dissipation sheet according to the present invention contains the first inorganic particles having an average aspect ratio of 2 or less, the second inorganic particles having an average aspect ratio of more than 2, and a binder resin. The heat dissipation sheet according to the present invention has the first surface on one side in the thickness direction and the second surface on the other side in the thickness direction. In the heat dissipation sheet according to the present invention, in 100% by volume of the region having a thickness of 15% from the first surface to the second surface, the content of the second inorganic particles is larger than the content of the first inorganic particles. The region having a thickness of 70% from the position 15/100 of the thickness to the position 85/100 of the thickness from the first surface to the second surface is taken as a central region. In the heat dissipation sheet according to the present invention, the content of the first inorganic particles in 100% by volume of the region having a thickness of 15% from the first surface to the second surface is larger than the content of the first inorganic particles in 100% by volume of the central region. Since the heat dissipation sheet according to the present invention is provided with the above-mentioned configuration, adhesiveness and long-term insulation reliability can be effectively enhanced.

The laminate according to the present invention includes a thermal conductor, an insulating layer laminated on one surface of the thermal conductor, and a conductive layer laminated on surface of the insulating layer opposite to the thermal conductor. In the laminate according to the present invention, the insulating layer contains the first inorganic particles having an average aspect ratio of 2 or less, the second inorganic particles having an average aspect ratio of more than 2, and a binder resin. In the laminate according to the present invention, the insulating layer has the first surface on one side in the thickness direction and the second surface on the other side in the thickness direction. In the laminate according to the present invention, in 100% by volume of the region having a thickness of 15% from the first surface to the second surface of the insulating layer, the content of the second inorganic particles is larger than the content of the first inorganic particles. The region having a thickness of 70% from the position 15/100 of the thickness to the position 85/100 of the thickness from the first surface to the second surface of the insulating layer is taken as a central region. In the laminate according to the present invention, the content of the first inorganic particles in 100% by volume of the region having a thickness of 15% from the first surface to the second surface of the insulating layer is larger than the content of the first inorganic particles in 100% by volume of the central region of the insulating layer. Since the laminate according to the present invention is provided with the above-mentioned configuration, adhesiveness and long-term insulation reliability can be effectively enhanced.

BRIEF DESCRIPTION OF DRAWINGS

FIG. 1 is a cross-sectional view schematically showing a heat dissipation sheet according to one embodiment of the present invention.

FIG. 2 is a cross-sectional view schematically showing a laminate obtained using the heat dissipation sheet according to one embodiment of the present invention.

FIG. 3 is a schematic view for explaining each region for which contents of first inorganic particles and second inorganic particles are to be obtained in the heat dissipation sheet according to the present invention.

MODE(S) FOR CARRYING OUT THE INVENTION

Hereinafter, the present invention will be described in detail.
(Heat Dissipation Sheet and Laminate)

The heat dissipation sheet according to the present invention contains the first inorganic particles having an average aspect ratio of 2 or less, the second inorganic particles having an average aspect ratio of more than 2, and a binder resin. The heat dissipation sheet according to the present invention contains a plurality of first inorganic particles. The heat dissipation sheet according to the present invention contains a plurality of second inorganic particles.

The heat dissipation sheet according to the present invention has the first surface on one side in the thickness direction and the second surface on the other side in the thickness direction. In the heat dissipation sheet according to the present invention, the first surface and the second surface face each other. In the heat dissipation sheet according to the present invention, in 100% by volume of a region having a thickness of 15% from the first surface to the second surface, the content of the second inorganic particles is larger than the content of the first inorganic particles. The region having a thickness of 70% from the position 15/100 of the thickness to the position 85/100 of the thickness from the first surface to the second surface is taken as a central region. In the heat dissipation sheet according to the present invention, the content of the first inorganic particles in 100% by volume of the region having a thickness of 15% from the first surface to the second surface is larger than the content of the first inorganic particles in 100% by volume of the central region.

The heat dissipation sheet according to the present invention is obtained by blending the first inorganic particles, the second inorganic particles, and the binder resin.

The laminate according to the present invention includes a thermal conductor, an insulating layer laminated on one surface of the thermal conductor, and a conductive layer laminated on a surface of the insulating layer opposite to the thermal conductor. In the laminate according to the present invention, the insulating layer contains the first inorganic particles having an average aspect ratio of 2 or less, the second inorganic particles having an average aspect ratio of more than 2, and a binder resin. In the laminate according to the present invention, the insulating layer contains a plurality of first inorganic particles. In the laminate according to the present invention, the insulating layer contains a plurality of second inorganic particles. In the laminate according to the present invention, the insulating layer has the first surface on one side in the thickness direction and the second surface on the other side in the thickness direction. In the laminate according to the present invention, in 100% by volume of the region having thickness of 15% from the first surface to the second surface of the insulating layer, the content of the second inorganic particles is larger than the content of the first inorganic particles. The region having a thickness of 70% from the position 15/100 of the thickness to the position 85/100 of the thickness from the first surface to the second surface of the insulating layer is taken as the central region. In the laminate according to the present invention, the content of the first inorganic particles in 100% by volume of the region having a thickness of 15% from the first surface to the second surface of the insulating layer is larger than the content of the first inorganic particles in 100% by volume of the central region of the insulating layer.

Since the heat dissipation sheet and the laminate according to the present invention are provided with the above-mentioned configuration, adhesiveness and long-term insulation reliability can be effectively enhanced.

In a laminate in which a conductive layer such as copper foil is laminated on the first surface of the heat dissipation sheet (in the laminate, the heat dissipation sheet is an insulating layer), when the heat dissipation sheet and the conductive layer peeled off, the form of peeling was observed. With respect to the form of peeling, the present inventors have found that peeling may occur in a region near the first surface of the heat dissipation sheet due to breaking or peeling off of the second inorganic particles oriented in a plane direction in the region near the first surface of the heat dissipation sheet.

In the heat dissipation sheet and the laminate according to the present invention, the region near the first surface of the heat dissipation sheet contains not only the second inorganic particles having a relatively large aspect ratio but also the first inorganic particles having a relatively small aspect ratio. In the heat dissipation sheet and the laminate according to the present invention, in the process of stacking a thermal conductor or a conductive layer such as copper foil on the heat dissipation sheet and producing a laminate by pressing or the like, the orientation of the second inorganic particles is controlled in a thickness direction by the first inorganic particles. Thus, the content of the second inorganic particles oriented in the plane direction can be reduced, so that peeling in the region near the first surface of the heat dissipation sheet can be made less likely to occur. The second inorganic particles oriented in the thickness direction function as anchors, so that peeling in the region near the first surface of the insulating layer can be made less likely to occur.

As a result, in the heat dissipation sheet and the laminate according to the present invention, the adhesiveness between the heat dissipation sheet and the conductive layer such as copper can be more effectively enhanced.

Furthermore, in the heat dissipation sheet and the laminate according to the present invention, the orientation of the second inorganic particles is controlled in the thickness direction in the region near the first surface of the heat dissipation sheet, and in addition, since the content of the second inorganic particles in a region other than the region near the first surface of the heat dissipation sheet can be increased, the thermal conduction of the heat dissipation sheet and the laminate can be more effectively enhanced. In particular, when boron nitride is used as the second inorganic particle, boron nitride has such a property that the thermal conductivity in the plane direction is higher than the thermal conductivity in the thickness direction, and the thermal conductivity is anisotropic, so that the thermal conduction the thickness direction can be more effectively enhanced by controlling the orientation of boron nitride.

In the laminate according to the present invention, a circuit pattern may be formed by treating copper foil, which is a conductive layer, by etching or the like. When the formed circuit pattern peels off from the laminate, partial discharge may occur between the peeled circuit pattern and an outer surface of the laminate to deteriorate the laminate and reduce the long-term insulation reliability. In the heat dissipation sheet and the laminate according to the present invention, since the adhesiveness between the heat dissipation sheet and the conductive layer such as copper foil can be enhanced as described above, it is possible to prevent the formed circuit pattern from peeling off from the laminate and to more effectively enhance the long-term insulation reliability. When the heat dissipation sheet is constituted only by the second inorganic particles, if stress concentration occurs at a portion where the concentration of the second inorganic particles is different inside the heat dissipation sheet, peeling in the plane direction tends to occur, and partial discharge in a peeling portion may lower the long-term insulation reliability. In the present invention, the first inorganic particles and the second inorganic particles are used, and peeling between layers can be suppressed by the first inorganic particles, so that the long-term insulation reliability can be more effectively enhanced. By using the first inorganic particles, viscosity of a material for heat dissipation sheet formation (curable material) before the formation of the heat dissipation sheet can be lowered, and a more uniform heat dissipation sheet can be produced.

In the heat dissipation sheet and the laminate according to the present invention, in 100% by volume of a region (R1) having a thickness of 15% from the first surface to the second surface, the content of the second inorganic particles is larger than the content of the first inorganic particles. The region (R1) is a region between a first surface 1a and a broken line L1 in FIG. 3.

From the viewpoint of more effectively enhancing the thermal conduction, the adhesiveness, and the long-term insulation reliability, the content of the first inorganic particles in 100% by volume of the region (R1) is preferably 5% by volume or more and more preferably 10% by volume or more, and preferably 35% by volume or less and more preferably 25% by volume or less.

From the viewpoint of more effectively enhancing the thermal conduction, the adhesiveness, and the long-term insulation reliability, the content of the second inorganic particles in 100% by volume of the region (R1) is preferably 10% by volume or more and more preferably 20% by volume or more, and preferably less than 50% by volume and more preferably 40% by volume or less.

In the heat dissipation sheet and the laminate according to the present invention, the content of the first inorganic particles in 100% by volume of the region (R1) is larger than the content of the first inorganic particles in 100% by volume of a region (R2) having a thickness of 70% from the position 15/100 of the thickness to the position 85/100 of the thickness from the first surface to the second surface. The region (R1) is a region between a first surface 1a and a broken line L1 in FIG. 3. The region (R2) is a region between the broken line L1 and a broken line L2 in FIG. 3.

From the viewpoint of more effectively enhancing the thermal conduction, the adhesiveness, and the long-term insulation reliability, the content of the first inorganic particles in 100% by volume of the region (R2) is preferably 0% volume (not containing) or more and more preferably 0.3% by volume or more, and preferably 7% by volume or less and more preferably 3% by volume or less.

From the viewpoint of more effectively enhancing the thermal conduction, the adhesiveness, and the long-term insulation reliability, the content of the second inorganic particles in 100% by volume of the region (R2) is preferably 0% by volume (not containing) or more and more preferably 0.5% by volume or more, and preferably 10% by volume or less and more preferably 5% by volume or less.

In the heat dissipation sheet and the laminate according to the present invention, in 100% by volume of a region (R3) having a thickness of 15% from the second surface to the first surface, the content of the second inorganic particles is preferably larger than the content of the first inorganic particles. The region (R3) is a region between a second surface 1b and the broken line L2 in FIG. 3.

In the heat dissipation sheet and the laminate according to the present invention, the content of the first inorganic particles in 100% by volume of the region (R3) having a thickness of 15% from the second surface to the first surface is preferably larger than the content of the first inorganic particles in 100% by volume of the region (R2). The region (R2) is a region between the broken line L1 and a broken line L2 in FIG. 3. The region (R3) is a region between a second surface 1b and the broken line L2 in FIG. 3.

From the viewpoint of more effectively enhancing the thermal conduction, the adhesiveness, and the long-term insulation reliability, the content of the first inorganic particles in 100% by volume of the region (R3) is preferably 5% by volume or more and more preferably 10% by volume or more, and preferably 35% by volume or less and more preferably 25% by volume or less.

From the viewpoint of more effectively enhancing the thermal conduction, the adhesiveness, and the long-term insulation reliability, the content of the second inorganic particles in 100% by volume of the region (R3) is preferably 10% by volume or more and more preferably 20% by volume or more, and preferably less than 50% by volume and more preferably 40% by volume or less.

The content of the inorganic particles in 100% by volume of the regions (R1), (R2), and (R3) can be calculated from an electron microscope image of a cross section of the heat dissipation sheet or the laminate.

(First Inorganic Particle)

The heat dissipation sheet and the laminate according to the present invention include the first inorganic particles. The first inorganic particles preferably have insulation properties. The first inorganic particles are preferably insulating particles. The first inorganic particle is, for example, an inorganic filler. At least one type of inorganic particle is used as the first inorganic particle. As the first inorganic particles, one type of inorganic particles may be used alone, and two or more types of inorganic particles may be used in combination. Two or more types of inorganic particles may be blended to constitute the first inorganic particle. The first inorganic particle may be constituted by mixing inorganic particles formed of a certain material with inorganic particles formed of a material different from the certain material.

In the heat dissipation sheet and the laminate according to the present invention, the average aspect ratio of the first inorganic particles is 2 or less. A lower limit of the average aspect ratio of the first inorganic particles is not particularly limited. The average aspect ratio of the first inorganic particles may be 1 or more.

The aspect ratio of the first inorganic particle represents a major diameter/minor diameter. The aspect ratio of the first inorganic particles is determined by observing randomly selected first inorganic particles with an electron microscope or an optical microscope, and measuring the major diameter/minor diameter of each inorganic particle. The average aspect ratio can be determined by averaging the aspect ratios of 50 random first inorganic particles. The average aspect ratio of 50 random first inorganic particles is approximately equal to the average aspect ratio of all the first inorganic particles.

In the heat dissipation sheet and the laminate according to the present invention, the particle diameter of the first inorganic particle is preferably 1 μm or more.

The particle diameter of the first inorganic particle means a diameter when the inorganic particles have spherical shape, and when the inorganic particles have a shape other than a spherical shape, the particle diameter of the first inorganic particle means a diameter of an assumed sphere equivalent in volume to the inorganic particle.

From the viewpoint of more effectively enhancing the thermal conduction, the adhesiveness, and the long-term insulation reliability, an average particle diameter of the first inorganic particles is preferably 6 μm or more and more preferably 7 μm or more, and preferably less than 20 μm and more preferably 18 μm or less.

The average particle diameter of the first inorganic particles is determined by averaging the particle diameters of all the first inorganic particles having an average aspect ratio of 2 or less.

The average particle diameter of the first inorganic particles is preferably an average particle diameter obtained by averaging particle diameters on a volume basis. The average particle diameter of the first inorganic particles is preferably a particle diameter (d50) of the first inorganic particles that is obtained when a cumulative volume of the first inorganic particles is 50%. The average particle diameter of the first inorganic particles can be measured using a "laser diffraction particle size distribution measuring apparatus" manufactured by HORIBA, Ltd. The average particle diameter of the first inorganic particles can be determined by observing randomly selected 50 first inorganic particles with an electron microscope or an optical microscope, measuring the particle diameter of each inorganic particle, and calculating an average value. The average particle diameter of 50 random first inorganic particles is approximately equal to the average particle diameter of all the first inorganic particles.

From the viewpoint of more effectively enhancing the thermal conduction, the adhesiveness, and the long-term insulation reliability, the average circularity of the first inorganic particles is preferably 0.70 or more and more preferably 0.80 or more, and preferably 1.00 or less.

In the calculation of the circularity of the first inorganic particle, a cross-sectional area (S) and a perimeter length (L) of the first inorganic particle randomly selected from an electron microscope image of a cross section of a laminate produced by mixing the first inorganic particle with a thermosetting resin or the like are measured, and the circularity of the first inorganic particle can be calculated by the following formula (1). The circularity described above is a value representing a degree of circularity, and means that as the circularity approaches 1, the shape becomes closer to a circle.

$$\text{Circularity} = [4\pi S/L^2] \quad (1)$$

The average circularity of the first inorganic particles is preferably 0.90 or more because the effects of the present invention can be effectively exhibited. The average circularity of the first inorganic particles may be more than 0.90.

The average circularity of the first inorganic particles is determined by averaging the circularities of all the first inorganic particles having an average aspect ratio of 2 or less.

The average circularity of the first inorganic particles can be determined by averaging the circularities of randomly selected 50 first inorganic particles. The average circularity of 50 random first inorganic particles is approximately equal to the average circularity of all the first inorganic particles.

The first inorganic particles are preferably spherical particles or rounded particles. The first inorganic particles may be spherical particles or rounded particles. Here, the spherical particle means a particle having the circularity of 0.95 or more. The rounded particles mean particles having a shape rounded overall and having few crystal corners and specifically mean particles having the above-mentioned circularity of 0.70 or more and 0.90 or less. When the first inorganic particles are spherical particles, the flowability of the heat dissipation sheet can be effectively improved. In the heat dissipation sheet and the laminate according to the present invention, when spherical particles are present near the surface, occurrence of electric field concentration can be suppressed, and occurrence of partial discharge can be suppressed. As a result, the long-term insulation reliability of the heat dissipation sheet and the laminate can be more effectively enhanced. When the first inorganic particles are rounded particles, the thermal conduction of the heat dissipation sheet and the laminate can be effectively enhanced. In the heat dissipation sheet and the laminate according to the present invention, as the first inorganic particles, only spherical particles or only rounded particles may be used, or the spherical particles and the rounded particles may be used in combination. In the heat dissipation sheet and the laminate according to the present invention, it is preferable to use the spherical particles and the rounded particles in combination as the first inorganic particles.

A material of the first inorganic particle is not particularly limited. The first inorganic particle is preferably an insulating filler. The material of the first inorganic particle does not necessarily need to be boron nitride. Examples of the material of the first inorganic particle include metal oxides such as aluminum oxide (alumina), calcium oxide and magnesium oxide, metal nitrides such as aluminum nitride and titanium nitride, metal hydroxides such as aluminum hydroxide and magnesium hydroxide, metal carbonates such as calcium carbonate and magnesium carbonate, metal silicates such as calcium silicate, hydrated metal compounds, crystalline silica, amorphous silica, boron nitride, silicon carbide, and diamonds. One kind of the materials of the first inorganic particle may be used alone, and two or more kinds thereof may be used in combination.

From the viewpoint of practical use and from the viewpoint of more effectively enhancing the thermal conduction, the material of the first inorganic particles preferably includes an aluminum element or a carbon element. From the viewpoint of practical use and from the viewpoint of more effectively enhancing the thermal conduction, the material of the first inorganic particle is preferably aluminum oxide (alumina), aluminum nitride, aluminum hydroxide or diamond and more preferably aluminum oxide (alumina) or diamond. One kind of these preferred materials may be used alone, and two or more kinds thereof may be used in combination.

From the viewpoint of more effectively enhancing the thermal conduction, the thermal conductivity of the first inorganic particle is preferably 10 W/m·K or more and more preferably 20 W/m·K or more. An upper limit of the thermal conductivity of the first inorganic particle is not particularly limited. The thermal conductivity of the first inorganic particle may be 300 W/m·K or less or 200 W/m·K or less. When the thermal conductivity of the first inorganic particle is in the above-mentioned preferable range, the adhesiveness and the insulation properties can be enhanced, and in addition, the thermal conduction can be enhanced.

From the viewpoint of more effectively enhancing the thermal conduction, the adhesiveness, and the long-term insulation reliability, the content of the first inorganic particles in 100% by volume of the heat dissipation sheet and 100% by volume of the insulating layer is preferably 2% by volume or more and more preferably 3% by volume or more, and preferably 20% by volume or less and more preferably 17% by volume or less.

From the viewpoint of more effectively enhancing the thermal conduction, the adhesiveness, and the long-term insulation reliability, in the heat dissipation sheet and the insulating layer, the first inorganic particles are preferably contained in an amount of 30% by volume or less, more preferably 25% by volume or less relative to 100% by volume of sum of the first inorganic particles and the second inorganic particles. The lower limit of the content of the first inorganic particles is not particularly limited relative to 100% by volume of sum of the first inorganic particles and the second inorganic particles. The content of the first inorganic particles may be 5% by volume or more or 10% by volume or more relative to 100% by volume of sum of the first inorganic particles and the second inorganic particles.

(Second Inorganic Particle)

The heat dissipation sheet and the laminate according to the present invention include the second inorganic particles. The second inorganic particles preferably have insulation properties. The second inorganic particles are preferably insulating particles. The second inorganic particle is, for example, an inorganic filler. The second inorganic particle is preferably an insulating filler. At least one type of inorganic particle is used as the second inorganic particle. As the second inorganic particles, one type of inorganic particles may be used alone, and two or more types of inorganic particles may be used in combination. Two or more types of inorganic particles may be blended to constitute the second inorganic particle. The second inorganic particle may be constituted by mixing inorganic particles formed of a certain material with inorganic particles formed of a material different from the certain material.

In the heat dissipation sheet and the laminate according to the present invention, the average aspect ratio of the second inorganic particles is more than 2. From the viewpoint of more effectively enhancing the thermal conduction, the adhesiveness, and the long-term insulation reliability, the average aspect ratio of the second inorganic particles is preferably 4 or more and more preferably 5 or more, and preferably 15 or less and more preferably 12 or less. The second inorganic particle is, for example, a plate-like filler. In the present specification, the plate-like filler is also included in the particles.

The aspect ratio of the second inorganic particle represents a major diameter/minor diameter. The aspect ratio of the second inorganic particle is determined by observing a cross section of a sheet or a laminate, produced by mixing and curing the second inorganic particles and a curable resin, with an electron microscope or an optical microscope and measuring the major diameter/minor diameter of the second inorganic particles. The average aspect ratio can be determined by averaging the aspect ratios of arbitrary 50 second inorganic particles. The average aspect ratio of 50 random second inorganic particles is approximately equal to the average aspect ratio of all the second inorganic particles.

In the heat dissipation sheet and the laminate according to the present invention, the particle diameter of the second inorganic particle is preferably 1 µm or more.

The particle diameter of the second inorganic particle is preferably a major diameter.

From the viewpoint of more effectively enhancing the thermal conduction, the adhesiveness, and the long-term insulation reliability, an average major diameter of the second inorganic particles is preferably 3 µm or more and more preferably 5 µm or more, and preferably 40 µm or less and more preferably 20 µm or less.

The average major diameter of the second inorganic particles is determined by averaging the major diameters of all the second inorganic particles having an average aspect ratio of more than 2.

The average major diameter of the second inorganic particles can be determined by observing randomly selected 50 second inorganic particles with an electron microscope or an optical microscope, measuring the major diameter of each inorganic particle, and calculating an average value. The average major diameter of 50 random second inorganic particles is approximately equal to the average major diameter of all the second inorganic particles. The average major diameter of the second inorganic particles can be also determined by observing a cross section of a sheet or a laminate, produced by mixing and curing the second inorganic particles and a curable resin, with an electron microscope or an optical microscope, measuring the major diameter of randomly selected 50 second inorganic particles, and calculating an average value.

From the viewpoint of more effectively enhancing the thermal conduction, the adhesiveness, and the long-term insulation reliability, the second inorganic particles are preferably primary particles constituting agglomerated particles.

The heat dissipation sheet and the laminate according to the present invention may include agglomerated particles. The second inorganic particles are preferably not agglomerated particles. Examples of the agglomerated particles include boron nitride agglomerated particles. Here, when the second inorganic particle is a primary particle constituting agglomerated particles, the average major diameter means the average major diameter of the primary particles.

From the viewpoint of more effectively enhancing the thermal conduction, the adhesiveness, and the long-term insulation reliability, a material of the second inorganic particle is preferably boron nitride. From the viewpoint of more effectively enhancing the thermal conduction, the adhesiveness, and the long-term insulation reliability, the boron nitride is preferably agglomerated particles. The boron nitride is not particularly limited. Examples the boron nitride include hexagonal boron nitride, cubic boron nitride, boron nitride prepared by a reduction-nitridation method using a boron compound and ammonia, boron nitride prepared from a boron compound and a nitrogen-containing compound such as melamine, and boron nitride prepared from sodium borohydride and ammonium chloride. From the viewpoint of more effectively enhancing the thermal conduction, the boron nitride is preferably hexagonal boron nitride.

From the viewpoint of more effectively enhancing the thermal conduction, the thermal conductivity of the second inorganic particle is preferably 10 W/m·K or more and more preferably 30 W/m·K or more. Since the second inorganic particle has a relatively large aspect ratio and may have anisotropy in thermal conductivity, the thermal conductivity of the second inorganic particle is preferably an average thermal conductivity. An upper limit of the thermal conductivity of the second inorganic particle is not particularly limited. The thermal conductivity of the second inorganic particle may be 300 W/m·K or less or 200 W/m·K or less. When the thermal conductivity of the second inorganic particle is in the above-mentioned preferable range, the adhesiveness and the insulation properties can be enhanced, and in addition, the thermal conduction can be enhanced.

From the viewpoint of more effectively enhancing the thermal conduction, the adhesiveness, and the long-term insulation reliability, the content of the second inorganic particles in 100% by volume of the heat dissipation sheet and 100% by volume of the insulating layer is preferably 35% by volume or more and more preferably 40% by volume or more, and preferably 65% by volume or less and more preferably 60% by volume or less.

From the viewpoint of more effectively enhancing the thermal conduction, the adhesiveness, and the long-term insulation reliability, in the heat dissipation sheet and the insulating layer, the content of the second inorganic particles relative to 100% by volume of sum of the first inorganic particles and the second inorganic particles is preferably 70% by volume or more and more preferably 75% by volume or more. From the viewpoint of more effectively enhancing the thermal conduction, the adhesiveness, and the long-term insulation reliability, in the heat dissipation sheet and the insulating layer, the content of the second inorganic particles relative to 100% by volume of sum of the first inorganic particles and the second inorganic particles is preferably 95% by volume or less and more preferably 90% by volume or less.

(Inorganic Particles Having Particle Diameter of Less than 1 μm)

The heat dissipation sheet and the laminate according to the present invention may contain inorganic particles (third inorganic particles) having a particle diameter of less than 1 μm. The heat dissipation sheet and the laminate according to the present invention may contain the third inorganic particles as the first inorganic particles, the third inorganic particles as the second inorganic particles, or the third inorganic particles as the first inorganic particles and the second inorganic particles. From the viewpoint of more effectively enhancing the thermal conduction, the adhesiveness, and the long-term insulation reliability, the heat dissipation sheet and the laminate preferably contain the third inorganic particles. The third inorganic particles may be agglomerated particles or primary particles constituting the agglomerated particles. A material of the third inorganic particle is not particularly limited. Examples of the material of the third inorganic particle include the above-mentioned material of the first inorganic particle and the above-mentioned material of the second inorganic particle.

The first inorganic second inorganic particles, and the third inorganic particles may be surface-treated with a surface treatment agent such as a silane coupling agent.

From the viewpoint of more effectively enhancing the thermal conduction, the particle diameter of the third inorganic particle is preferably less than 1 μm. The particle diameter of the third inorganic particle can be determined by the above-mentioned method of calculating the particle diameter of the first inorganic particle or the particle diameter of the second inorganic particle.

In the heat dissipation sheet and the laminate according to the present invention, the content of the third inorganic particles is not particularly limited. From the viewpoint of more effectively enhancing the thermal conduction, the content of the third inorganic particles in 100% by volume of the heat dissipation sheet and 100% by volume of the insulating layer is preferably 0.5% by volume or more and more preferably 1% by volume or more, and preferably 5% by volume or less and more preferably 3% by volume or less.

(Binder Resin: Thermosetting Compound)

The heat dissipation sheet and the laminate according to the present invention include a binder resin. The binder resin is not particularly limited. As the binder resin, a known insulating resin is used. The binder resin preferably contains a thermoplastic component (thermoplastic compound) or a curable component and more preferably contains the curable component. Examples of the curable component include a thermosetting component and a photocurable component. The thermosetting component preferably contains a thermosetting compound and a thermosetting agent. The photocurable component preferably contains a photocurable compound and a photoinitiator. The binder resin preferably contains a thermosetting component. The binder resin preferably contains a thermosetting compound and a thermosetting agent. The thermosetting component may contain a curing accelerator. The binder resin may contain a curing accelerator. One kind of the binder resin may be used alone, and two or more kinds thereof may be used in combination.

The thermosetting compound is not particularly limited. Examples of the thermosetting compound include styrene compounds, phenoxy compounds, oxetane compounds, epoxy compounds, episulfide compounds, (meth)acrylic compounds, phenol compounds, amino compounds, unsaturated polyester compounds, polyurethane compounds, silicone compounds and polyimide compounds. One kind of the thermosetting compound may be used alone, and two or more kinds thereof may be used in combination.

From the viewpoint of more effectively enhancing the thermal conduction, the adhesiveness, and the long-term insulation reliability, the thermosetting compound preferably contains an epoxy compound. The epoxy compound is an organic compound having at least one epoxy group. One kind of the epoxy compound may be used alone, and two or more kinds thereof may be used in combination.

Examples of the epoxy compound include a bisphenol A type epoxy compound, a bisphenol F type epoxy compound, a bisphenol S type epoxy compound, a phenol novolac type epoxy compound, a biphenyl type epoxy compound, a biphenyl novolac type epoxy compound, a biphenol type epoxy compound, a naphthalene type epoxy compound, a fluorene type epoxy compound, a phenol aralkyl type epoxy compound, a naphthol aralkyl type epoxy compound, a dicyclopentadiene type epoxy compound, an anthracene type epoxy compound, an epoxy compound having an adamantane skeleton, an epoxy compound having a tricyclodecane skeleton, a naphthylene ether type epoxy compound, and an epoxy compound having a triazine nucleus in its skeleton.

From the viewpoint of more effectively enhancing the thermal conduction, the adhesiveness, and the long-term insulation reliability, the epoxy compound is preferably a bisphenol A type epoxy compound.

From the viewpoint of more effectively enhancing the thermal conduction, the adhesiveness, and the long-term insulation reliability, the content of the thermosetting compound in 100% by volume of the heat dissipation sheet is preferably 20% by volume or more and more preferably 25% by volume or more, and preferably 80% by volume or less and more preferably 70% by volume or less. From the viewpoint of more effectively enhancing the thermal conduction, the adhesiveness, and the long-term insulation reliability, a content of a component derived from the thermosetting compound in 100% by volume of the insulating layer is preferably 20% by volume or more and more preferably 25% by volume or more, and preferably 80% by volume or less and more preferably 70% by volume or less.

(Binder Resin: Thermosetting Agent)

For the heat dissipation sheet and the laminate according to the present invention, a thermosetting agent is preferably used together with the thermosetting compound. The thermosetting agent is not particularly limited. As the thermosetting agent, a thermosetting agent capable of curing the thermosetting compound can be used suitably. Also, as used herein, the thermosetting agent includes a curing catalyst. One kind of the thermosetting agents may be used alone, and two or more kinds thereof may be used in combination.

Examples of the thermosetting agent include cyanate ester compounds (cyanate ester curing agents), phenolic compounds (phenol thermosetting agents), amine compounds (amine thermosetting agents), thiol compounds (thiol thermosetting agents), imidazole compounds, phosphine compounds, acid anhydrides, active ester compounds, and dicyandiamide. The thermosetting agent preferably has a functional group capable of reacting with an epoxy group of the epoxy compound described above.

Examples of the cyanate ester compound include novolac type cyanate ester resins, bisphenol type cyanate ester resins, and prepolymers obtained by partially trimerizing those. Examples of the novolac type cyanate ester resins include phenol novolac type cyanate ester resins, and alkylphenol type cyanate ester resins. Examples of the bisphenol type cyanate ester resins include bisphenol A type cyanate ester resins, bisphenol E type cyanate ester resins, and tetramethyl bisphenol F type cyanate ester resins.

Examples of commercially available products of the cyanate ester compound include phenol novolac type cyanate ester resins ("PT-30" and "PT-60" manufactured by Lonza Japan Ltd.), and prepolymers ("BA-230S," "BA-3000S," "BTP-1000S," and "BTP-6020S" manufactured by Lonza Japan Ltd.) obtained by trimerizing bisphenol type cyanate ester resins.

Examples of the phenolic compound include novolac type phenols, biphenol type phenols, naphthalene type phenols, dicyclopentadiene type phenols, aralkyl type phenols, and dicyclopentadiene type phenols.

Examples of commercially available products of the phenolic compound include novolac type phenols ("TD-2091" manufactured by DIC Corporation), biphenyl novolac type phenols ("MEHC-7851" manufactured by Meiwa Plastic Industries, Ltd.), aralkyl type phenolic compounds ("MEH-7800" manufactured by Meiwa Plastic Industries, Ltd.), and phenols ("LA1356" and "LA3018-50P" manufactured by DIC Corporation) having an aminotriazine skeleton.

The total content of the thermosetting compound and the thermosetting agent in 100% by volume of the heat dissipation sheet is preferably 20% by volume or more and more preferably 25% by volume or more, and preferably 50% by volume or less and more preferably 45% by volume or less. The total content of a component derived from the thermosetting compound and the thermosetting agent in 100% by volume of the insulating layer is preferably 20% by volume or more and more preferably 25% by volume or more, and preferably 50% by volume or less and more preferably 45% by volume or less. When the above-mentioned total content is in the range from the above lower limit to the above upper limit inclusive, the thermal conduction and the adhesiveness can be more effectively enhanced. A content ratio of the thermosetting compound and the thermosetting agent is appropriately selected so that the thermosetting compound cures.

The content of the thermosetting agent is appropriately selected so that the thermosetting compound cures well. The content of the thermosetting agent is preferably 1 part by weight or more and more preferably 3 parts by weight or more, and preferably 50 parts by weight or less and more preferably 30 parts by weight or less based on 100 parts by weight of the thermosetting compound. When the content of the thermosetting agent is more than or equal to the above lower limit, it is more easy to sufficiently cure the thermosetting compound. When the content of the thermosetting agent is less than or equal to the above upper limit, an excess thermosetting agent that does not contribute to curing is less likely to be generated. Thus, heat resistance and adhesiveness of a cured product are further enhanced.

(Other Ingredients)

Other than the above-described ingredients, the heat dissipation sheet may include other ingredients, which are generally used for a resin sheet and a curable sheet, such as a curing accelerator, a dispersant, a chelating agent, and an oxidation inhibitor. The heat dissipation sheet may contain a polymer component in order to enhance formability of a heat dissipation sheet and the like. Examples of the polymer component include polyimide. The heat dissipation sheet may contain a solvent. From the viewpoint of further suppressing generation of voids in a heat dissipation sheet or the like, the content of the solvent in 100% by weight of the heat dissipation sheet is preferably 5% by weight or less.

(Other Details of Heat Dissipation Sheet)

A method for producing the heat dissipation sheet includes a step of blending the first inorganic particles, the second inorganic particles, and the binder resin. In the above step, a method of blending the first inorganic particles, the second inorganic particles, and the binder resin can be a conventionally known mixing method, and is not particularly limited. Examples of the method of blending the first inorganic particles, the second inorganic particles, and the binder resin include a kneading method using a homodisper stirrer.

(Other Details of Laminate)

The laminate according to the present invention includes a thermal conductor, an insulating layer, and a conductive layer. The insulating layer is laminated on one surface of the thermal conductor. The conductive layer is laminated on a surface of the insulating layer opposite to the thermal conductor. The insulating layer may be laminated also on the other surface of the thermal conductor. In the laminate according to the present invention, the material of the insulating layer is the heat dissipation sheet described above. In the laminate according to the present invention, the insulating layer is preferably the above-mentioned cured product of the heat dissipation sheet. Talc cured product may be obtained by applying heat and pressure treatment to the heat dissipation sheet using a press or the like.

Thermal Conductor:

The thermal conductivity of the thermal conductor is preferably 10 W/m·K or more. As the thermal conductor, an appropriate thermal conductor can be used. It is preferable to use a metal material for the thermal conductor. Examples of the metal material include metal foil and a metal plate. The thermal conductor is preferably the metal foil or the metal plate and more preferably the metal plate.

Examples of the material of the metal material include aluminum, copper, gold, silver, a graphite sheet. From the viewpoint of more effectively enhancing the thermal conduction, the material of the metal material is preferably aluminum, copper or gold, and more preferably aluminum or copper.

Conductive Layer:

The metal for forming the conductive layer is not particularly limited. Examples of the metal include gold, silver, palladium, copper, platinum, zinc, iron, tin, lead, aluminum, cobalt, indium, nickel, chromium, titanium, antimony, bismuth, thallium, germanium, cadmium, silicon, tungsten, molybdenum, and alloys of these. Further examples of the metal include tin-doped indium oxide (ITO) and solder. From the viewpoint of more effectively enhancing the thermal conduction, aluminum, copper or gold is preferable, and aluminum or copper is more preferable.

A method of forming the conductive layer is not particularly limited. Examples of the method of forming the conductive layer include a method by electroless plating, a method by electroplating, and a method of thermocompression-bonding the insulating layer and metal foil. The method of thermocompression-bonding the insulating layer and metal foil is preferable because the conductive layer can be formed in a simple manner.

FIG. 1 is a cross-sectional view schematically showing a heat dissipation sheet according to one embodiment of the present invention. For convenience of illustration, the size and thickness shown in FIG. 1 are different from the actual size and thickness.

A heat dissipation sheet 1 shown in FIG. 1 contains first inorganic particles 11, second inorganic particles 12, and a binder resin 13. The first inorganic particles 11 are preferably the first inorganic particles described above, and the second inorganic particles 12 are preferably the second inorganic particles described above.

The heat dissipation sheet 1 according to the present embodiment has one surface (first surface) 1a and the other surface (second surface) 1b. In the heat dissipation sheet 1 according to the present embodiment, in 100% by volume of a region having a thickness of 15% from the first surface 1a to the second surface 1b, the content of the second inorganic particles 12 is larger than the content of the first inorganic particles 11. In the heat dissipation sheet 1 according to the present embodiment, the content of the first inorganic particles 11 in 100% by volume of the region having a thickness of 15% is larger than the content of the first inorganic particles 11 in 100% by volume of a region having a thickness of 70% from a position 15/100 of the thickness to a position 85/100 of the thickness from the first surface 1a to the second surface 1b.

In the heat dissipation sheet according to the present invention, in 100% by volume of a region having a thickness of 15% from the second surface to the first surface, the content of the second inorganic particles is preferably larger than the content of the first inorganic particles. In the heat dissipation sheet according to the present invention, the content of the first inorganic particles in 100% by volume of the region having a thickness of 15% is preferably larger than the content of the first inorganic particles in 100% by volume of a region having a thickness of 70% from the position 15/100 of the thickness to the position 85/100 of the thickness from the first surface to the second surface.

In the heat dissipation sheet 1 according to the present embodiment, the binder resin 13 preferably contains a thermosetting compound and a thermosetting agent. The binder resin is preferably not completely cured. The binder resin may be B-staged by heating or the like. The binder resin may be a B-staged product.

FIG. 2 is a cross-sectional view schematically showing a laminate obtained using the heat dissipation sheet according to one embodiment of the present invention. For convenience of illustration, the size and thickness shown in FIG. 2 are different from the actual size and thickness.

A laminate 21 shown in FIG. 2 includes an insulating layer 22, a conductive layer 23, and a thermal conductor 24. The insulating layer 22, the conductive layer 23, and the thermal conductor 24 are the above-described insulating layer, conductive layer, and thermal conductor. In FIG. 2, the heat dissipation sheet 1 shown in FIG. 1 is used as the insulating layer 22.

The insulating layer 22 has one surface (first surface) 22a and the other surface (second surface) 22b. The conductive layer 23 has one surface (first surface) 23a and the other surface (second surface) 23b. The insulating layer 24 has one surface (first surface) 24a and the other surface (second surface) 24b.

The conductive layer 23 is laminated on the side of one surface (first surface) 22a of the insulating layer 22. The thermal conductor 24 is laminated on the side of the other surface (second surface) 22b of the insulating layer 22. The insulating layer 22 is laminated on the side of the other surface (second surface) 23b of the conductive layer 23. The insulating layer 22 is laminated on the side of one surface (first surface) 24a of the thermal conductor 24. The insulating layer 22 is disposed between the conductive layer 23 and the thermal conductor 24.

The method of producing the laminate is not particularly limited. Examples of the method of producing the laminate include a method in which the thermal conductor, the insulating layer, and the conductive layer are stacked and thermocompression-bonded by vacuum pressing or the like. The vacuum does not have to be provided during pressing.

In the laminate 21 according to the present embodiment, the insulating layer 22 contains the first inorganic particles 11 having an average aspect ratio of 2 or less, the second inorganic particles 12 having an average aspect ratio of more than 2, and a cured product portion 25. The insulating layer 22 is formed by the heat dissipation sheet 1 shown in FIG. 1. It is preferable that the insulating layer be formed by thermocompression-bonding the heat dissipation sheet described above using a vacuum press or the like.

In the laminate 21 according to the present embodiment, in 100% by volume of a region having a thickness of 15% from the first surface 22a to the second surface 22b of the insulating layer 22, the content of the second inorganic particles 12 is larger than the content of the first inorganic particles 11, A region having a thickness of 70% from a positon 15/100 of the thickness to a position 85/100 of the thickness from the first surface 22a to the second surface 22b of the insulating layer 22 is taken as a central region. In the laminate 21 according to the present embodiment, the content of the first inorganic particles 11 in 100% by volume of the region having a thickness of 15% from the first surface 22a to the second surface 22b of the insulating layer 22 is larger than the content of the first inorganic particles 11 in 100% by volume of the central region of the insulating layer 22.

In the laminate according to the present invention, in 100% by volume of the region having a thickness of 15% from the second surface to the first surface of the insulating layer, the content of the second inorganic particles is preferably larger than the content of the first inorganic particles. The region having a thickness of 70% from the position 15/100 of the thickness to the position 85/100 of the thickness from the first surface to the second surface of the insulating layer is taken as a central region. In the laminate according to the present invention, the content of the first inorganic particles in 100% by volume of the region having a thickness of 15% from the second surface to the first surface of the insulating layer is preferably larger than the content of the first inorganic particles in 100% by volume of the central region of the insulating layer.

In the present embodiment, the cured product portion 25 is a portion in which the binder resin 13 in FIG. 1 is cured. The cured product portion 25 is obtained by curing the binder resin 13. The cured product portion 25 may be a portion in which a binder resin containing a thermosetting compound and a thermosetting agent is cured.

The heat dissipation sheet can be used in various applications where high thermal conduction, high mechanical strength, and the like are required. For example, the laminate is disposed between a heat generation component and a heat dissipation component to be used in electronic equipment. For example, the laminate is used as a radiator installed between a CPU and a fin or a radiator of a power card used in inverters of electric vehicles and the like. Further, the laminate may be used as an insulating circuit board by forming a circuit by etching or the like of the conductive layer of the laminate.

Hereinafter, the present invention will be clarified by way of specific examples and comparative examples of the present invention. The present invention is not limited to the following examples.

Binder Resin (Thermosetting Compound):
(1) "Epicoat 828US" manufactured by Mitsubishi Chemical Corporation, epoxy compound
(2) "NC-3000" manufactured by Nippon Kayaku Co., Ltd., epoxy compound
(3) "HP-4032D" manufactured by DIC Corporation, naphthalene type epoxy compound Binder Resin (Thermosetting Agent):
(1) "Dicyandiamide" manufactured by Tokyo Chemical Industry Co., Ltd.
(2) "2MZA-PW" manufactured by Shikoku Chemicals Corporation, isocyanurate-modified solid dispersed imidazole
(3) Cyanate ester compound-containing liquid ("BA-3000S" manufactured by Lonza Japan, solid content: 75% by weight), the solid content is described in Examples.

Binder Resin (Curing Accelerator):
(1) Imidazole compound (2-phenyl-4-methylimidazole, "2P4MZ" manufactured by Shikoku Chemicals Corporation, anionic curing accelerator)

Inorganic Particle
(1) "AS-50" manufactured by Showa Denko K. K., average particle diameter: 9 μm, average aspect ratio: 1.2 (average aspect ratio is 2 or less), average circularity: 0.78, thermal conductivity: 30 W/m·K, aluminum oxide
(2) "AX10-75" manufactured by Micron, Inc., average particle diameter: 8 μm, average aspect ratio: 1.0 (average aspect ratio is 2 or less), average circularity: 0.99, thermal conductivity: 30 W/m·K, aluminum oxide
(3) "CB-P05" manufactured by Showa Denko K. K., average particle diameter: 4 μm, average aspect ratio: 1.0 (average aspect ratio is 2 or less), average circularity: 0.99, thermal conductivity: 30 W/m·K, aluminum oxide
(4) "CB-P15" manufactured by Showa Denko K. K., average particle diameter: 16 μm, average aspect ratio: 1.0 (average aspect ratio is 2 or less), average circularity: 0.99, thermal conductivity: 30 W/m·K, aluminum oxide
(5) "AS-30" manufactured by Showa Denko K. K., average particle diameter: 18 μm, average aspect ratio: 1.2 (average aspect ratio is 2 or less), average circularity: 0.78, thermal conductivity: 30 W/m·K, aluminum oxide
(6) "CB-A40" manufactured by Showa Denko K. K., average particle diameter: 40 μm, average aspect ratio: 1.0 (average aspect ratio is 2 or less), circularity: 0.99, thermal conductivity: 30 W/m·K, aluminum oxide
(7) "PTX25" manufactured by Momentive Performance Materials Inc., average major diameter: 7 μm, average aspect ratio: 12 (average aspect ratio is more than 2), thermal conductivity: 60 W/m·K, boron nitride agglomerated particles
(8) "UHP-G1H" manufactured by Showa Denko K. K., average major diameter: 4 μm, average aspect ratio: 7 (average aspect ratio is more than 2), thermal conductivity: 60 W/m·K, boron nitride agglomerated particles
(9) "PTX60" manufactured by Momentive Performance Materials Inc., average major diameter: 7 μm, average aspect ratio: 12 (average aspect ratio is more than 2), thermal conductivity: 60 W/m·K, boron nitride agglomerated particles
(10) "HP-40" manufactured by Mizushima Ferroalloy Co. Ltd., average major diameter: 7 μm, average aspect ratio: 7 (average aspect ratio is more than 2), thermal conductivity: 60 W/m·K, boron nitride agglomerated particles
(11) "PT110" manufactured by Momentive Performance Materials Inc., average major diameter: 45 μm, average aspect ratio: 9.5 (average aspect ratio is more than 2), thermal conductivity: 60 W/m·K, boron nitride
(12) "PT100" manufactured by Momentive Performance Materials average major diameter: 13 μm, average aspect ratio: 16 (average aspect ratio is more than 2), thermal conductivity: 60 W/m·K, boron nitride (Average Aspect Ratio of Inorganic Particles)

The average aspect ratio of the inorganic particles was measured as follows.

Method of Measuring Average Aspect Ratio of Inorganic Particles:

The average aspect ratio of the inorganic particle was determined by observing a cross section of a sheet or a laminate, produced by mixing and curing the inorganic particles and a curable resin, with an electron microscope or an optical microscope, measuring the major diameter/minor diameter of each of randomly selected 50 inorganic particles, and calculating an average value.

(Average Particle Diameter of Inorganic Particles)

The average particle diameter of the inorganic particles was measured as follows.

Method of Measuring Average Particle Diameter of Inorganic Particles:

The average particle diameter of the inorganic particles was measured using a "laser diffraction particle size distribution measuring apparatus" manufactured by HORIBA, Ltd., and a value of the particle diameter (d50) of the inorganic particle was calculated when the cumulative volume of the inorganic particles was 50%.

(Average Major Diameter of Inorganic Particles)

The average major diameter of the inorganic particles was measured as follows.

Method of Measuring Average Major Diameter of Inorganic Particles:

A cross section of a sheet or a laminate produced by mixing and curing the inorganic particles and a curable resin was observed with an electron microscope or an optical microscope, the major diameters of randomly selected 50 inorganic particles were measured, and an average value was calculated.

EXAMPLES 1, 2, 4 TO 7, 8 TO 10, AND 13

(1) Preparation of Curable Materials A and B

Blending was carried out such that based on 100 parts by weight of "Epicoat 828US" manufactured by Mitsubishi Chemical Corporation, "Dicyandiamide" manufactured by Tokyo Chemical Industry Co., Ltd. had an amount of 10 parts by weight, and "2MZA-PW" manufactured by Shikoku Chemicals Corporation had an amount of 1 part by weight. Next, inorganic particles indicated in Tables 1 to 3 below were blended in the blending amounts (% by volume) indicated in Tables 1 to 3 below, and stirred with a planetary stirrer at 500 rpm for 25 minutes to obtain curable materials A and B.

(2) Production of Laminate

The obtained curable material A was coated on a release PET sheet (50 μm thick) to have a thickness of 100 μm and dried in an oven at 50° C. for 10 minutes to form a first curable material layer, and thus to obtain a first heat dissipation sheet. Next, the obtained curable material B was coated on a release PET sheet (50 μm thick) to have a thickness of 300 μm and dried in an oven at 50° C. for 10 minutes to form a second curable material layer, and thus to obtain a second heat dissipation sheet. The obtained two first and second heat dissipation sheets were superimposed to obtain a heat dissipation sheet. The obtained heat dissipation sheet has a first surface that is the surface of the first curable material layer formed, and a second surface that is the surface of the second curable material layer formed.

Thereafter, release PET sheet was peeled off, copper foil was stacked on the first surface of the heat dissipation sheet, and an aluminum plate was stacked on the second surface of the heat dissipation sheet. The stacked layers were vacuum-pressed at a temperature of 200° C. and a pressure of 12 MPa to produce a laminate. The thickness of an insulating layer formed by curing the heat dissipation sheet of the obtained laminate was 200 μm.

EXAMPLE 3

In the same manner as in Example 1, curable materials A and B were obtained. The obtained curable material A was coated on a release PET sheet (50 μm thick) to have a thickness of 50 μm and dried in an oven at 50° C. for 20 minutes to form a first curable material layer, and thus to obtain a first heat dissipation sheet. Next, the obtained curable material B was coated on a release PET sheet (50 μm thick) to have a thickness of 300 μm and dried in an oven at 50° C. for 20 minutes to form a second heat dissipation sheet. In addition, the obtained curable material A was coated on a release PET sheet (50 μm thick) to have a thickness of 50 μm and dried in an oven at 50° C. for 20 minutes to form a third curable material layer, and thus to obtain a third heat dissipation sheet. The obtained three first, second and third heat dissipation sheets were set so as to sandwich the second heat dissipation sheet between the first and third heat dissipation sheets. A heat dissipation sheet in which the first, second and third heat dissipation sheets were superimposed was sandwiched between copper foil and an aluminum plate such that the first heat dissipation sheet and the third heat dissipation sheet were in contact with the copper foil and the aluminum plate, respectively. The obtained heat dissipation sheet has a first surface that is the surface of the first curable material layer formed, and a second surface that is the surface of the third curable material layer formed.

Thereafter, the release PET sheet was peeled off, copper foil was stacked on the first surface of the heat dissipation sheet, and an aluminum plate was stacked on the second surface of the heat dissipation sheet. The stacked layers were vacuum-pressed at a temperature of 200° C. and a pressure of 12 MPa to produce a laminate. The thickness of an insulating layer formed by curing the heat dissipation sheet of the obtained laminate was 200 μm.

EXAMPLE 11

Blending was carried out such that based on 100 parts by weight of "NC-3000" manufactured by Nippon Kayaku Co., Ltd., "HP-4032D" manufactured by DIC Corporation had an amount of 50 parts by weight, a cyanate ester compound-containing liquid, "BA3000-S" had an amount of 150 parts by weight, and an imidazole compound, "2P4MZ" had an amount of 0.3 parts by weight. Next, the inorganic particles indicated in Table 3 below were blended in the blending amounts (% by volume) indicated in Table 3 below, and stirred with a planetary stirrer at 500 rpm for 25 minutes to obtain curable materials A and B.

A laminate was produced in the same manner as Example 1, except that the obtained curable materials A and B were used. The thickness of an insulating layer formed by curing the heat dissipation sheet of the obtained laminate was 200 μm.

EXAMPLE 12

A curable material A was produced in the same manner as in Example 1. Blending was carried out such that based on 100 parts by weight of "NC-3000" manufactured by Nippon Kayaku Co., Ltd., "HP-4032D" manufactured by DIC Corporation had an amount of 50 parts by weight, a cyanate ester compound-containing liquid, "BA3000-S" had an amount of 150 parts by weight, and an imidazole compound, "2P4MZ" had an amount of 0.3 parts by weight. Next, the inorganic particles indicated in Table 3 below were blended in the blending amounts (% by volume) indicated in Table 3 below to obtain a curable material B.

A laminate was produced in the same manner as Example 1, except that the obtained curable materials A and B were used. The thickness of an insulating layer formed by curing the heat dissipation sheet of the obtained laminate was 200 µm.

EXAMPLE 14

A curable material A was produced in the same manner as in Example 1. Blending was carried out such that based on 100 parts by weight of "NC-3000" manufactured by Nippon Kayaku Co., Ltd., "HP-4032D" manufactured by DIC Corporation had an amount of 50 parts by weight, a cyanate ester compound-containing liquid, "BA3000-S" had an amount of 150 parts by weight, and an imidazole compound, "2P4MZ" had an amount of 0.3 parts by weight. Next, the inorganic particles indicated in Table 3 below were blended in the blending amounts (% by volume) indicated in Table 3 below to obtain a curable material B.

A laminate was produced in the same manner as Example 3, except that the obtained curable materials A and B were used. The thickness of an insulating layer formed by curing the heat dissipation sheet of the obtained laminate was 200 µm.

COMPARATIVE EXAMPLES 1 TO 5

A laminate was produced in the same manner as Example 1, except that the amounts of the inorganic particles of the curable materials A and B were changed to the amounts indicated in Table 4 in the process of producing the curable materials A and B. The thickness of an insulating layer formed by curing the heat dissipation sheet of the obtained laminate was 200 µm.
(Evaluation)
(1) Presence or Absence of First Inorganic Particle and Second Inorganic Particle In the obtained curable material A, it was confirmed whether the first inorganic particles and the second inorganic particles were blended. The presence or absence of the first inorganic particles and the second inorganic particles was judged on the basis of the following criteria.
[Criteria for Judgment in Presence or Absence of First Inorganic Particle and Second Inorganic Particle]
  ○: The first inorganic particles and the second inorganic particles were blended in the curable material A.
  x: The first inorganic particle or the second inorganic particle was not blended in the curable material A.
(2) Content of First Inorganic Particles and Second Inorganic Particles The cross section of the obtained laminate was processed for smoothing by a cross section polisher ("IB-19500CP" manufactured by JEOL Ltd.), and the cross section of the processed laminate was observed by a field emission scanning electron microscope ("S-4800" manufactured by Hitachi High-Technologies Corporation). The first inorganic particles and the second inorganic particles were identified by an energy dispersive X-ray spectrometer ("S-4800EN-EDS" manufactured by Hitachi High-Technologies Corporation).

The content of the first inorganic particles in 100% by volume of the region (R1) having a thickness of 15% from the first surface to the second surface of the heat dissipation sheet (the contents of the first inorganic particles and the second inorganic particles in 100% by volume of the region (R1)) was calculated from the obtained electron microscope image. Further, the first inorganic particles in 100% by volume of a region (R region 2) having a thickness of 70% from the position 15/100 of the thickness to the position 85/100 of the thickness from the first surface to the second surface of the heat dissipation sheet (the contents of the first inorganic particles and the second inorganic particles in 100% by volume of (region R2)) were calculated. Furthermore, the content of the first inorganic particles in 100% by volume of the region (R3) having a thickness of 15% from the second surface to the first surface of the heat dissipation sheet (the contents of the first inorganic particles and the second inorganic particles in 100% by volume of (R3)) was calculated.
(3) Thermal Conductivity The obtained laminate was cut into 1 cm squares, and then carbon black was sprayed on both sides to prepare a measurement sample. The thermal conductivity was calculated by a laser flash method using the obtained measurement sample. A relative value obtained when the value of Comparative Example 1 was expressed as 1.0 was calculated, and the thermal conductivity was judged on the basis of the following criteria.
[Criteria for Judgment in Thermal Conductivity]
  ○○: thermal conductivity was 1.5 or more.
  ○: Thermal conductivity was more than 1.1 and less than 1.5.
  x: Comparative Example 1 (1.0), or thermal conductivity was equivalent to Comparative Example 1 (1.0) (being equivalent means a range of 0.9 times to 1.1 times)
(4) 90 Degree Peel Strength The obtained laminate was cut out to the size of 50 mm×120 mm to obtain a test sample. Copper foil was peeled off so that copper foil with a width of 10 mm was left in the center of the obtained test sample, and the peel strength of the copper foil was measured according to JIS C 6481 with respect to the copper foil with a width of 10 mm in the center. As a peel strength tester for measuring the peel strength, a "Tensilon universal testing machine" manufactured by Orientec K. K. was used. For 20 test samples, the peel strength of the copper foil was measured. An average value of measurement values of the peel strength of the copper foil in the 20 test samples was taken as 90 degree peel strength. A relative value obtained when the value of Comparative Example 1 was expressed as 1.0 was calculated, and the 90 degree peel strength was judged on the basis of the following criteria.
[Criteria for Judgment in 90 Degree Peel Strength]
  ○○: 90 degree peel strength was 1.2 or more.
  ○: 90 degree peel strength was more than 1.0 and less than 1.2.
  Δ: Comparative Example 1 (1.0)
  x: 90 degree peel strength was less than 1.0.
(5) Dielectric Breakdown Strength By etching copper foil in the obtained laminate, the copper foil was patterned into a circle having a diameter of 2 cm to obtain a test sample. An alternating voltage was applied between the test samples at a temperature of 25° C. using a withstand voltage tester ("MODEL7473" manufactured by E-Tech Electronics Ltd.) so that the voltage was increased at a rate of 0.33 kV/sec. A voltage at which a current of 10 mA flowed through the test sample was taken as a dielectric breakdown voltage. The dielectric breakdown voltage was divided by the thickness of the test sample and thereby normalized to calculate the dielectric breakdown strength. The dielectric breakdown strength was judged on the basis of the following criteria.

[Criteria for Judgment in Dielectric Breakdown Strength]
  ∘∘: 60 kV/mm or more
  ∘: 30 kV/mm or more and less than 60 kV/mm
  x: less than 30 kV/mm (6) Long-Term Insulation Reliability 20 test samples were obtained in the same manner as (5) above. Using the obtained 20 test samples, an AC voltage of 3 kV was applied between the test samples for 1000 hours under an environment of a temperature of 85° C. and a humidity of 85% to evaluate whether or not dielectric breakdown occurred. The long-term insulation reliability was judged on the basis of the following criteria.

[Criteria for Judgment in Long-Term Insulation Reliability]
  ∘∘: 0 test samples where dielectric breakdown occurred
  ∘: 1 or more and less than 3 test samples where dielectric breakdown occurred
  Δ: 3 or more and less than 1W0 test samples where dielectric breakdown occurred
  x: 10 or more test samples where dielectric breakdown occurred The results are shown in the following Tables 1 to 4.

TABLE 1

| | | | Example 1 | Example 2 | Example 3 | Example 4 | Example 5 |
|---|---|---|---|---|---|---|---|
| Curable material A | Amount (vol %) of inorganic particles | AS-50 | 25 | | | 25 | 25 |
| | | AX10-75 | | 25 | | | |
| | | CB-P05 | | | 25 | | |
| | | CB-P15 | | | | | |
| | | PTX25 | 30 | | | | |
| | | UHP-G1H | | 30 | | | |
| | | HP-40 | | | 30 | 35 | 30 |
| Curable material B | Amount (vol %) of inorganic particles | CB-P05 | 2 | | | | |
| | | AS-30 | | 3 | 3 | | 5 |
| | | CB-A40 | | | | | |
| | | UHP-G1H | 60 | | | | |
| | | PTX60 | | 60 | 60 | | 55 |
| | | HP-40 | | | | 60 | |
| | | PT110 | | | | | 5 |
| | | PT100 | | | | | |
| Content (vol %) of first inorganic particles in 100 vol % of heat dissipation sheet | | | 10 | 10 | 10 | 8 | 12 |
| Content (vol %) of second inorganic particles in 100 vol % of heat dissipation sheet | | | 50 | 50 | 50 | 52 | 52 |
| Curable material A | Content (vol %) of first inorganic particles relative to 100 vol % of sum of first inorganic particles and second inorganic particles | | 45 | 45 | 45 | 42 | 45 |
| | Content (vol %) of second inorganic particles relative to 100 vol % of sum of first inorganic particles and second inorganic particles | | 55 | 55 | 55 | 58 | 55 |
| Curable material B | Content (vol %) of first inorganic particles relative to 100 vol % of sum of first inorganic particles and second inorganic particles | | 3 | 5 | 5 | 0 | 8 |
| | Content (vol %) of second inorganic particles relative to 100 vol % of sum of first inorganic particles and second inorganic particles | | 97 | 95 | 95 | 100 | 92 |
| Heat dissipation sheet | Content (vol %) of first inorganic particles relative to 100 vol % of sum of first inorganic particles and second inorganic particles | | 17 | 18 | 18 | 14 | 20 |
| | Content (vol %) of second inorganic particles relative to 100 vol % of sum of first inorganic particles and second inorganic particles | | 83 | 82 | 82 | 86 | 80 |
| Evaluation | Presence or absence of first inorganic particle and second inorganic particle in curable material A | | ∘ | ∘ | ∘ | ∘ | ∘ |
| | Content (vol %) of first inorganic particles in 100 vol % of region (R1) | | 45 | 45 | 45 | 42 | 45 |
| | Content (vol %) of second inorganic particles in 100 vol % of region (R1) | | 55 | 55 | 55 | 58 | 55 |
| | Content (vol %) of first inorganic particles in 100 vol % of region (R2) | | 3 | 5 | 5 | 0 | 8 |
| | Content (vol %) of second inorganic particles in 100 vol % of region (R2) | | 97 | 95 | 95 | 100 | 92 |
| | Content (vol %) of first inorganic particles in 100 vol % of region (R3) | | 3 | 5 | 45 | 0 | 8 |
| | Content (vol %) of second inorganic particles in 100 vol % of region (R3) | | 97 | 95 | 55 | 100 | 92 |
| | Thermal conductivity | | ∘ | ∘ | ∘ | ∘∘ | ∘ |
| | 90 degree peel strength | | ∘∘ | ∘ | ∘ | ∘∘ | ∘∘ |
| | Dielectric breakdown strength | | ∘ | ∘∘ | ∘∘ | ∘∘ | ∘∘ |
| | Long-term insulation reliability | | ∘ | ∘∘ | ∘∘ | ∘ | ∘ |

TABLE 2

| | | Example 6 | Example 7 | Example 8 | Example 9 | Example 10 |
|---|---|---|---|---|---|---|
| Curable material A Amount (vol %) of inorganic particles | AS-50 | | | | 25 | 25 |
| | AX10-75 | | | 22 | | |
| | CB-P05 | 25 | | | | |
| | CB-P15 | | 15 | | | |
| | PTX25 | | | | 30 | 30 |
| | UHP-G1H | | | | | |
| | HP-40 | 30 | 40 | 23 | | |
| Curable material B Amount (vol %) of inorganic particles | CB-P05 | | | | | |
| | AS-30 | | | 15 | | 3 |
| | CB-A40 | | | | 5 | |
| | UHP-G1H | 30 | | 45 | 40 | |
| | PTX60 | | | | 20 | |
| | HP-40 | 30 | 60 | | | 40 |
| | PT110 | | | | | |
| | PT100 | | | | | 20 |
| Content (vol %) of first inorganic particles in 100 vol % of heat dissipation sheet | | 8 | 5 | 17 | 12 | 10 |
| Content (vol %) of second inorganic particles in 100 vol % of heat dissipation sheet | | 50 | 53 | 38 | 50 | 50 |
| Curable material A | Content (vol %) of first inorganic particles relative to 100 vol % of sum of first inorganic particles and second inorganic particles | 45 | 27 | 49 | 45 | 45 |
| | Content (vol %) of second inorganic particles relative to 100 vol % of sum of first inorganic particles and second inorganic particles | 55 | 73 | 51 | 55 | 55 |
| Curable material B | Content (vol %) of first inorganic particles relative to 100 vol % of sum of first inorganic particles and second inorganic particles | 0 | 0 | 25 | 8 | 5 |
| | Content (vol %) of second inorganic particles relative to 100 vol % of sum of first inorganic particles and second inorganic particles | 100 | 100 | 75 | 92 | 95 |
| Heat dissipation sheet | Content (vol %) of first inorganic particles relative to 100 vol % of sum of first inorganic particles and second inorganic particles | 15 | 9 | 33 | 20 | 18 |
| | Content (vol %) of second inorganic particles relative to 100 vol % of sum of first inorganic particles and second inorganic particles | 85 | 91 | 67 | 80 | 82 |
| Evaluation | Presence or absence of first inorganic particle and second inorganic particle in curable material A | ○ | ○ | ○ | ○ | ○ |
| | Content (vol %) of first inorganic particles in 100 vol % of region (R1) | 45 | 27 | 49 | 45 | 45 |
| | Content (vol %) of second inorganic particles in 100 vol % of region (R1) | 55 | 73 | 51 | 55 | 55 |
| | Content (vol %) of first inorganic particles in 100 vol % of region (R2) | 0 | 0 | 25 | 8 | 5 |
| | Content (vol %) of second inorganic particles in 100 vol % of region (R2) | 100 | 100 | 75 | 92 | 95 |
| | Content (vol %) of first inorganic particles in 100 vol % of region (R3) | 0 | 0 | 25 | 8 | 5 |
| | Content (vol %) of second inorganic particles in 100 vol % of region (R3) | 100 | 100 | 75 | 92 | 95 |
| | Thermal conductivity | ○○ | ○○ | ○ | ○ | ○ |
| | 90 degree peel strength | ○ | ○ | ○ | ○ | ○ |
| | Dielectric breakdown strength | ○○ | ○○ | ○ | ○ | ○ |
| | Long-term insulation reliability | ○○ | ○○ | ○ | ○ | ○ |

TABLE 3

| | | Example 11 | Example 12 | Example 13 | Example 14 |
|---|---|---|---|---|---|
| Curable material A Amount (vol %) of inorganic particles | AS-50 | 25 | 25 | | |
| | AX10-75 | | | 20 | 20 |
| | CB-P05 | | | 5 | 5 |
| | CB-P15 | | | | |
| | PTX25 | 30 | | | |
| | UHP-G1H | | 30 | 15 | 15 |
| | HP-40 | | | 15 | 15 |

TABLE 3-continued

| | | | Example 11 | Example 12 | Example 13 | Example 14 |
|---|---|---|---|---|---|---|
| Curable material B | Amount (vol %) of inorganic particles | CB-P05 | 2 | 3 | 2 | 2 |
| | | AS-30 | | | 2 | 2 |
| | | CB-A40 | | | | |
| | | UHP-G1H | 60 | | | |
| | | PTX60 | | | 20 | 20 |
| | | HP-40 | | 60 | 40 | 40 |
| | | PT110 | | | | |
| | | PT100 | | | | |
| Content (vol %) of first inorganic particles in 100 vol % of heat dissipation sheet | | | 10 | 10 | 11 | 11 |
| Content (vol %) of second inorganic particles in 100 vol % of heat dissipation sheet | | | 50 | 50 | 50 | 50 |
| Curable material A | Content (vol %) of first inorganic particles relative to 100 vol % of sum of first inorganic particles and second inorganic particles | | 45 | 45 | 45 | 45 |
| | Content (vol %) of second inorganic particles relative to 100 vol % of sum of first inorganic particles and second inorganic particles | | 55 | 55 | 55 | 55 |
| Curable material B | Content (vol %) of first inorganic particles relative to 100 vol % of sum of first inorganic particles and second inorganic particles | | 3 | 5 | 6 | 6 |
| | Content (vol %) of second inorganic particles relative to 100 vol % of sum of first inorganic particles and second inorganic particles | | 97 | 95 | 94 | 94 |
| Heat dissipation sheet | Content (vol %) of first inorganic particles relative to 100 vol % of sum of first inorganic particles and second inorganic particles | | 17 | 18 | 19 | 19 |
| | Content (vol %) of second inorganic particles relative to 100 vol % of sum of first inorganic particles and second inorganic particles | | 83 | 82 | 81 | 81 |
| Evaluation | Presence or absence of first inorganic particle and second inorganic particle in curable material A | | ○ | ○ | ○ | ○ |
| | Content (vol %) of first inorganic particles in 100 vol % of region (R1) | | 45 | 45 | 45 | 45 |
| | Content (vol %) of second inorganic particles in 100 vol % of region (R1) | | 55 | 55 | 55 | 55 |
| | Content (vol %) of first inorganic particles in 100 vol % of region (R2) | | 3 | 5 | 6 | 6 |
| | Content (vol %) of second inorganic particles in 100 vol % of region (R2) | | 97 | 95 | 94 | 94 |
| | Content (vol %) of first inorganic particles in 100 vol % of region (R3) | | 3 | 5 | 6 | 45 |
| | Content (vol %) of second inorganic particles in 100 vol % of region (R3) | | 97 | 95 | 94 | 55 |
| | Thermal conductivity | | ○ | ○○ | ○○ | ○ |
| | 90 degree peel strength | | ○○ | ○○ | ○○ | ○ |
| | Dielectric breakdown strength | | ○ | ○○ | ○○ | ○○ |
| | Long-term insulation reliability | | ○ | ○ | ○ | ○○ |

TABLE 4

| | | | Comparative Example 1 | Comparative Example 2 | Comparative Example 3 | Comparative Example 4 | Comparative Example 5 |
|---|---|---|---|---|---|---|---|
| Curable material A | Amount (vol %) of inorganic particles | AS-50 | | | | 30 | |
| | | AX10-75 | | | | 30 | |
| | | CB-P05 | 45 | 15 | | | 25 |
| | | CB-P15 | | | | | |
| | | PTX25 | 10 | | | | |
| | | UHP-G1H | | | | 30 | 50 |
| | | HP-40 | | 40 | | | |
| Curable material B | Amount (vol %) of inorganic particles | CB-P05 | | 35 | | 30 | |
| | | AS-30 | | | | 35 | |
| | | CB-A40 | | | | | |
| | | UHP-G1H | 60 | | 60 | | |
| | | PTX60 | | | | | |
| | | HP-40 | | 30 | | | 60 |
| | | PT110 | | | | | |
| | | PT100 | | | | | |

TABLE 4-continued

|  |  | Comparative Example 1 | Comparative Example 2 | Comparative Example 3 | Comparative Example 4 | Comparative Example 5 |
|---|---|---|---|---|---|---|
| Content (vol %) of first inorganic particles in 100 vol % of heat dissipation sheet |  | 15 | 28 | 20 | 52 | 0 |
| Content (vol %) of second inorganic particles in 100 vol % of heat dissipation sheet |  | 43 | 33 | 40 | 10 | 57 |
| Curable material A | Content (vol %) of first inorganic particles relative to 100 vol % of sum of first inorganic particles and second inorganic particles | 82 | 27 | 100 | 45 | 0 |
|  | Content (vol %) of second inorganic particles relative to 100 vol % of sum of first inorganic particles and second inorganic particles | 18 | 73 | 0 | 55 | 100 |
| Curable material B | Content (vol %) of first inorganic particles relative to 100 vol % of sum of first inorganic particles and second inorganic particles | 0 | 54 | 0 | 100 | 0 |
|  | Content (vol %) of second inorganic particles relative to 100 vol % of sum of first inorganic particles and second inorganic particles | 100 | 46 | 100 | 0 | 100 |
| Heat dissipation sheet | Content (vol %) of first inorganic particles relative to 100 vol % of sum of first inorganic particles and second inorganic particles | 27 | 45 | 33 | 82 | 0 |
|  | Content (vol %) of second inorganic particles relative to 100 vol % of sum of first inorganic particles and second inorganic particles | 73 | 55 | 67 | 18 | 100 |
| Evaluation | Presence or absence of first inorganic particle and second inorganic particle in curable material A | ○ | ○ | x | x | x |
|  | Content (vol %) of first inorganic particles in 100 vol % of region (R1) | 55 | 27 | 100 | 45 | 0 |
|  | Content (vol %) of second inorganic particles in 100 vol % of region (R1) | 45 | 73 | 0 | 55 | 100 |
|  | Content (vol %) of first inorganic particles in 100 vol % of region (R2) | 0 | 54 | 0 | 100 | 0 |
|  | Content (vol %) of second inorganic particles in 100 vol % of region (R2) | 100 | 46 | 100 | 0 | 100 |
|  | Content (vol %) of first inorganic particles in 100 vol % of region (R3) | 0 | 54 | 0 | 100 | 0 |
|  | Content (vol %) of second inorganic particles in 100 vol % of region (R3) | 100 | 46 | 100 | 0 | 100 |
|  | Thermal conductivity | x | x | x | x | ○○ |
|  | 90 degree peel strength | Δ | ○ | ○ | ○ | x |
|  | Dielectric breakdown strength | ○ | x | ○ | x | ○ |
|  | Long-term insulation reliability | Δ | Δ | Δ | x | Δ |

EXPLANATION OF SYMBOLS

1: Heat dissipation sheet
1a: One surface (first surface)
1b: The other surface (second surface)
11: First inorganic particle
12: Second inorganic particle
13: Binder resin
21: Laminate
22: Insulating layer
22a: One surface (first surface)
22b: The other surface (second surface)
23: Conductive layer
23a: One surface (first surface)
23b: The other surface (second surface)
24: Thermal conductor
24a: One surface (first surface)
24b: The other surface (second surface)
25: Cured product portion (portion in which binder resin is cured)

The invention claimed is:

1. A heat dissipation sheet comprising:
first inorganic particles having an average aspect ratio of 2 or less;
second inorganic particles having an average aspect ratio of more than 2; and
a binder resin,
the heat dissipation sheet having a first surface on one side in a thickness direction and a second surface on the other side in the thickness direction,
a content of the second inorganic particles being larger than a content of the first inorganic particles in 100% by volume of a region having a thickness of 15% from the first surface to the second surface,
the content of the first inorganic particles in 100% by volume of the region having a thickness of 15% from the first surface to the second surface being larger than the content of the first inorganic particles in 100% by volume of a region having a thickness of 70% from a position 15/100 of the thickness to a position 85/100 of the thickness from the first surface to the second surface.

2. The heat dissipation sheet according to claim 1, containing 30% by volume or less of the first inorganic particles relative to 100% by volume of sum of the first inorganic particles and the second inorganic particles.

3. The heat dissipation sheet according to claim 1, wherein an average particle diameter of the first inorganic particles is less than 20 μm.

4. The heat dissipation sheet according to claim 1, wherein a material of the first inorganic particles comprises an aluminum element or a carbon element.

5. The heat dissipation sheet according to claim 1, wherein an average circularity of the first inorganic particles is 0.9 or more.

6. The heat dissipation sheet according to claim 1, wherein the average aspect ratio of the second inorganic particles is 15 or less.

7. The heat dissipation sheet according to claim 1, wherein a material of the second inorganic particles is boron nitride.

8. The heat dissipation sheet according to claim 7, wherein the boron nitride comprises agglomerated particles.

9. The heat dissipation sheet according to claim 1, wherein thermal conductivity of the first inorganic particles and thermal conductivity of the second inorganic particles are each 10 W/m·K or more.

10. The heat dissipation sheet according to claim 1, wherein the binder resin contains a thermosetting compound and a thermosetting agent.

11. A method for producing the heat dissipation sheet according to claim 1, the method comprising
 a step of blending the first inorganic particles having an average aspect ratio of 2 or less, the second inorganic particles having an average aspect ratio of more than 2, and the binder resin.

12. A laminate comprising:
 a thermal conductor;
 an insulating layer laminated on one surface of the thermal conductor; and
 a conductive layer laminated on a surface of the insulating layer opposite to the thermal conductor,
 the insulating layer comprising first inorganic particles having an average aspect ratio of 2 or less, second inorganic particles having an average aspect ratio of more than 2, and a binder resin,
 the insulating layer having a first surface on one side in a thickness direction and a second surface on the other side in the thickness direction,
 a content of the second inorganic particles being larger than a content of the first inorganic particles in 100% by volume of a region having a thickness of 15% from the first surface to the second surface of the insulating layer,
 the content of the first inorganic particles in 100% by volume of the region having a thickness of 15% from the first surface to the second surface of the insulating layer being larger than the content of the first inorganic particles in 100% by volume of a region having a thickness of 70% from a position 15/100 of the thickness to a position 85/100 of the thickness from the first surface to the second surface of the insulating layer.

13. The heat dissipation sheet according to claim 1, wherein a content of the first inorganic particles is 2% by volume or more and 20% by volume or less in 100% by volume of the heat dissipation sheet.

14. The heat dissipation sheet according to claim 1, comprising a first curable material layer and a second curable material layer,
 wherein the first surface of the heat dissipation sheet is a surface of the first curable material layer formed and the second surface of the heat dissipation sheet is a surface of the second curable material layer formed.

* * * * *